(12) United States Patent
Mishima

(10) Patent No.: US 7,002,282 B2
(45) Date of Patent: Feb. 21, 2006

(54) SURFACE ACOUSTIC WAVE DEVICE AND METHOD OF FABRICATING THE SAME

(75) Inventor: Naoyuki Mishima, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 10/764,480

(22) Filed: Jan. 27, 2004

(65) Prior Publication Data

US 2004/0227431 A1 Nov. 18, 2004

(30) Foreign Application Priority Data

Jan. 28, 2003 (JP) ............................. 2003-018777
Nov. 7, 2003 (JP) ............................. 2003-377893

(51) Int. Cl.
*H03H 3/08* (2006.01)
*H03H 9/25* (2006.01)
*H01L 41/08* (2006.01)

(52) U.S. Cl. ............................. 310/313 R; 310/313 A; 310/313 B; 310/313 C; 310/344; 438/106; 257/678; 333/193; 333/194; 333/195; 333/196

(58) Field of Classification Search ........ 333/195–198; 310/313 R; 257/678
See application file for complete search history.

(56) References Cited

U.S. PATENT DOCUMENTS

2002/0003459 A1 * 1/2002 Yatsuda et al. ............. 333/193

FOREIGN PATENT DOCUMENTS

EP 1076414 A2 * 2/2001
JP 7-336186 12/1995

* cited by examiner

*Primary Examiner*—Darren Schuberg
*Assistant Examiner*—J. Aguirrechea
(74) *Attorney, Agent, or Firm*—Arent Fox PLLC

(57) ABSTRACT

A surface acoustic wave device includes a surface acoustic wave filter element having a piezoelectric substrate on which comb-like electrodes are formed, and a package having a first cavity in which the surface acoustic wave filter is housed. The package includes a flexible chip mounting base having a first surface on which the surface acoustic wave filter is mounted and having a thickness equal to or less than 100 μm.

18 Claims, 17 Drawing Sheets

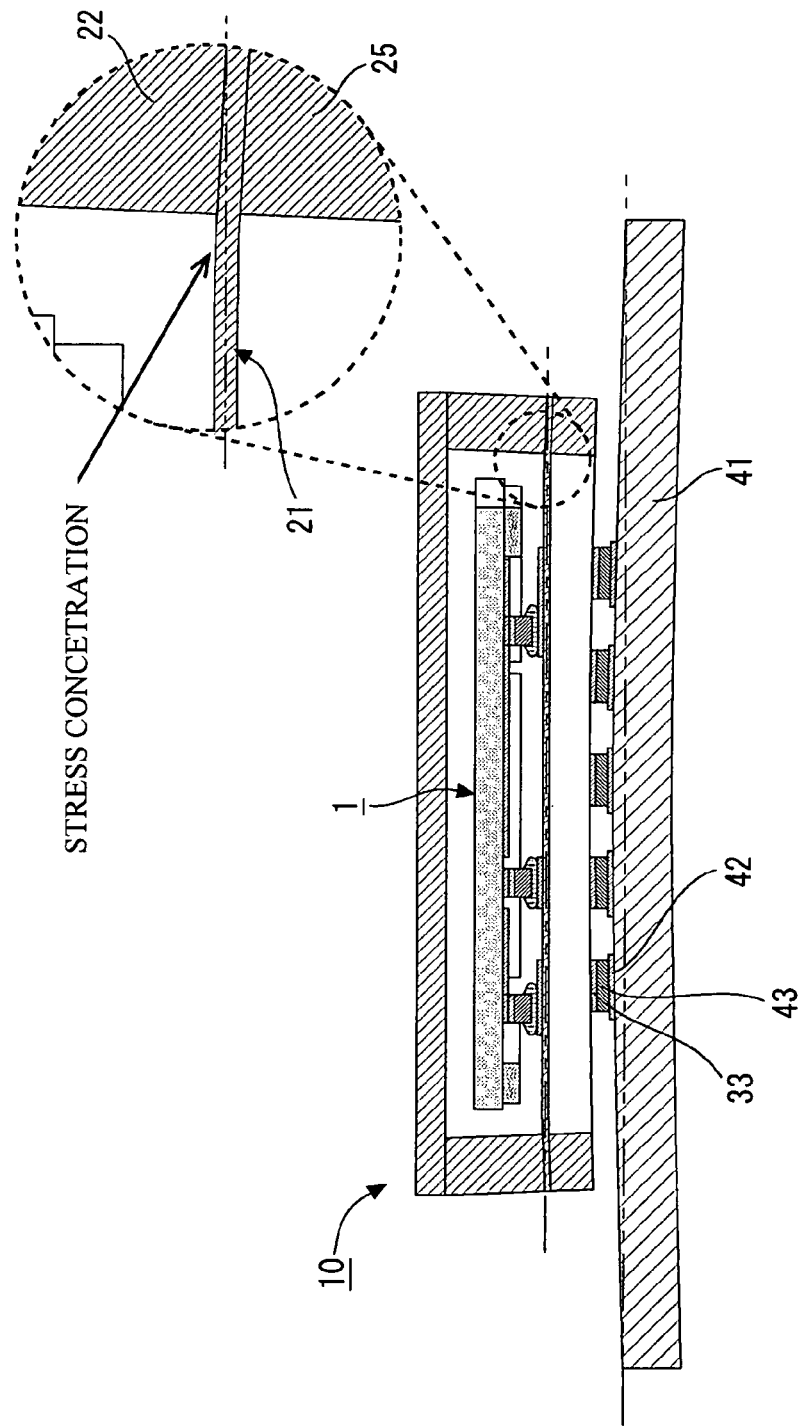

SURFACE ACOUSTIC WAVE DEVICE AND METHOD OF FABRICATING THE SAME

BACKGROUND OF THE INVENTION

1. Field of the Invention

The present invention generally relates to a surface acoustic wave device and a method of fabricating the same, and more particularly, to a surface acoustic wave device suitably used for a filter device or an oscillator embedded in a television set (hereinafter referred to as TV), a video tape recorder (VTR), a digital video disk (DVD) player, a cellular phone or the like, and a method of fabricating such a device.

2. Description of the Related Art

Nowadays, the surface acoustic wave (SAW) device is widely used for various circuits that process radio frequency signals in the band of 45 MHz to 2 GHz. Examples of such circuits are a transmit band-pass filter, a receive band-pass filter, a local oscillation filter, an antenna duplexer, an intermediate frequency filter, and an FM modulator.

Recently, these devices for signal processing have been downsized, and it has been strongly demanded to downsize electronic components used therein including the SAW device. Particularly, the portable electronic devices such as cellular phones need a SAW device that allows face-down mounting and has a low package height.

FIG. 1 shows a conventional compact-size SAW device that is face-down mounted. A SAW device 900 has a SAW filter chip 901, which is flip-chip mounted in a container (also referred to as package) composed of a chip mounting base 921, an enclosure member 922, and a lit member 923. An on-board wiring or interconnection line 931 is provided on a surface of the chip mounting base 921 exposed to the cavity of the package (that surface being defined as an upper surface). The on-base interconnection line 931, which is positioned so as to correspond to bumps 911 of the SAW filter chip 901, is electrically connected thereto.

The on-board interconnection line 931 is electrically connected to a terminal 933 provided on the back surface of the chip mounting base 921 by a via interconnection 932 that penetrates through the chip mounting base 921. As is shown in FIG. 2, the terminal 933 is connected to an on-board wiring or interconnection line 942 provided on a parts mounting board 941 by a solder 943.

In many cases, the package that houses the SAW filter chip 901 is made of ceramics, as disclosed in Japanese Laid-Open Patent Application No. 7-336186.

It is required that the electronic parts mounted on the printed-circuit board are prevented from being broken due to bending of the board. As shown in FIG. 2, the SAW device 900 is tested by distorting the parts mounting board 941 on which the parts are fixed by soldering. This is called a board bending test.

Generally, the SAW filter chip used in the band of 800 MHz to 1.9 GHz employed in the cellular phone systems has a size smaller than 2 mm×2 mm. Thus, deforming of the package in the board bending test is ignorable, so that satisfactory reliability can be secured. However, the SAW filter chip used in the band of 30 MHz to 75 MHz in which the SAW device is used as the TV intermediate frequency filter has a size as large as 10 mm×2 mm. Thus, the board bending test deforms the package considerably. This results in large stress on the bump bonding via which the SAW filter chip is connected to the package. As is shown in FIG. 2, large stress may break joining of the bump 911 and the on-base interconnection line 931, and thus degrades the mounting reliability.

SUMMARY OF THE INVENTION

It is an object of the present invention to provide a SAW device that is resistant to bending and a method of fabricating such a SAW device.

This object of the present invention is achieved by a surface acoustic wave device comprising: a surface acoustic wave filter element having a piezoelectric substrate on which comb-like electrodes are formed; and a package having a first cavity in which the surface acoustic wave filter is housed, the package including a flexible chip mounting base that has a first surface on which the surface acoustic wave filter is mounted and has a thickness equal to or less than 100 µm.

The above object of the present invention is achieved by a method of fabricating a surface acoustic wave device comprising the steps of: face-down bonding a surface acoustic wave filter chip on a flexible chip mounting base having a thickness equal to or less than 100 µm; and attaching a first frame member to which a lid is attached to define a first cavity to the flexible chip mounting base so that the surface acoustic wave filter chip is housed in the first cavity and is hermetically sealed.

The above object of the present invention is also achieved by a method of fabricating a surface acoustic wave device comprising the steps of: attaching a first frame member to a flexible chip mounting base having a thickness equal to or less than 100 µm, the first frame member defining a cavity; face-down bonding a first surface acoustic wave filter chip to the flexible chip mountingbase; and attaching a lid to the first frame member so that the surface acoustic wave filter chip is accommodated in the first cavity and is hermetically sealed.

The above object of the present invention is also achieved by a method of fabricating a surface acoustic wave device comprising the steps of: attaching a surface acoustic wave filter chip to a backside of a lid with an adhesive; and faced-down bonding the surface acoustic wave filter chip to a flexible chip mounting base to which a first frame member defining a first cavity is attached, so that the surface acoustic wave filter chip is housed in the first cavity and is hermetically sealed, the flexible chip mounting base having a thickness equal to or less than 100 µm.

BRIEF DESCRIPTION OF THE DRAWINGS

Other objects, features and advantages of the present invention will become more apparent from the following detailed description when read in conjunction with the accompanying drawings, in which:

FIG. 5 is a diagram that explains effects of the first embodiment brought about when a parts mounting board on which the SAW device is mounted is subject to a board bending test;

DESCRIPTION OF THE PREFERRED EMBODIMENTS (First Embodiment)

Figure 1:
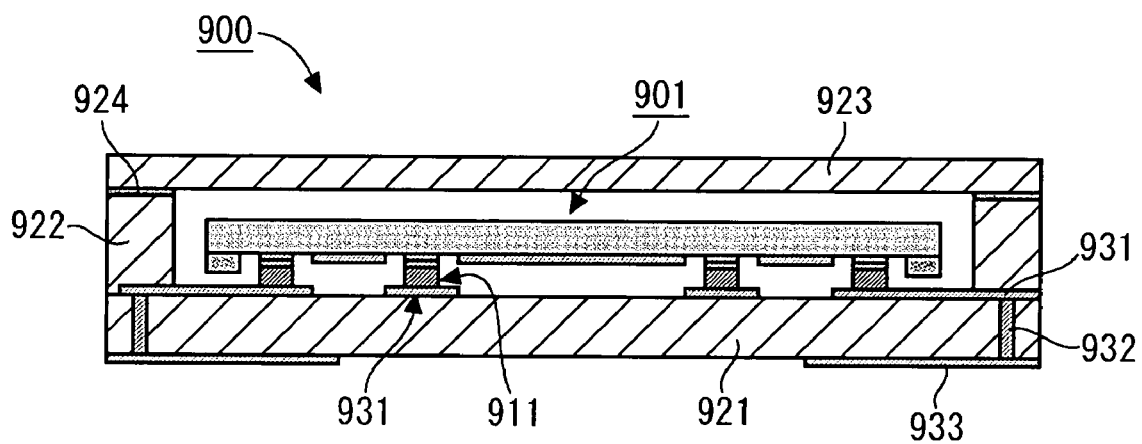
FIG. 1 is a cross-sectional view of a conventional SAW device.
Figure 2:
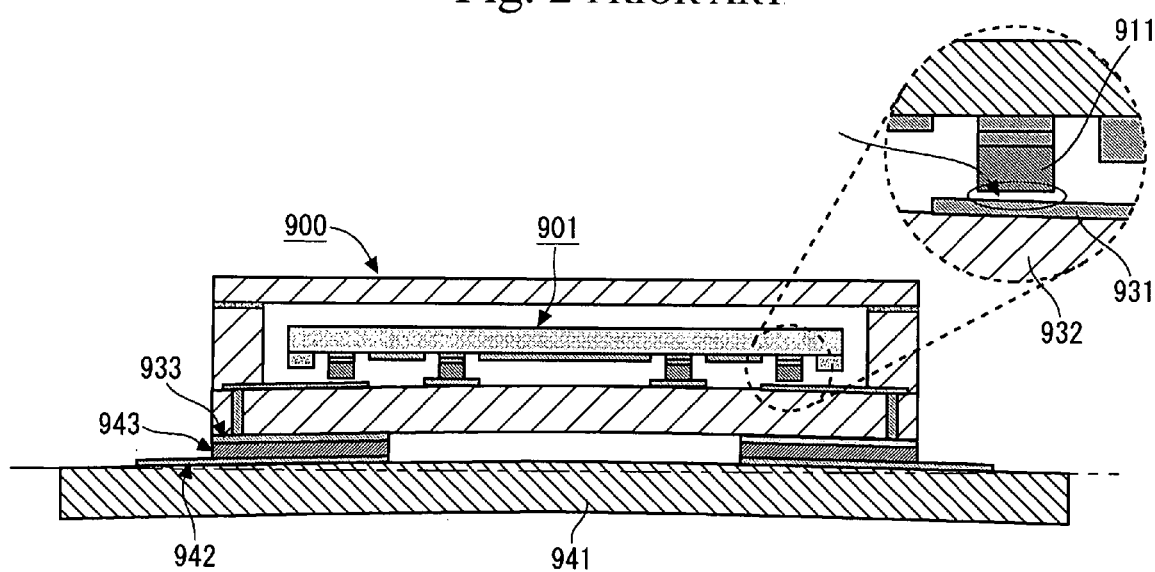
FIG. 2 is a cross-sectional view of the conventional SAW device that is mounted on a parts mounting board.
Figure 3:
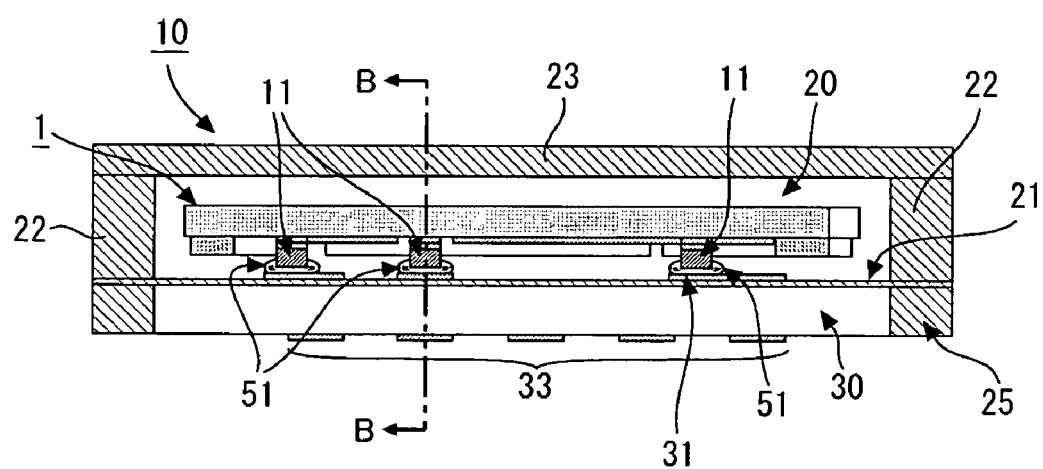
FIG. 3A is a plan view of a SAW device chip according to a first embodiment of the present invention.
FIG. 3B is a cross-sectional view taken along a line A—A shown in FIG. 3A.
FIG. 3C is a cross-sectional view taken along a line B—B shown in FIGS. 3A and 3B.
FIG. 3D is a bottom view of the SAW device shown in FIGS. 3A through 3C.

FIG. 3A is a plan view of a SAW filter chip 1 used in a first embodiment of the present invention, and FIG. 3B is a cross-sectional view of a SAW device 10 including the SAW filter chip 1 taken along a line A—A shown in FIGS. 3A, 3C and 3D. FIG. 3C is a cross-sectional view taken along a line B—B shown in FIGS. 3A and 3B, and FIG. 3D is a bottom view of the SAW device 10. The SAW device 10 may be used in the TV intermediate frequency band.

As shown in FIG. 3A, the SAW chip 1 has a piezoelectric substrate 12 on which comb-like electrodes (interdigital transducers: IDTs) 13, and electrode terminals are patterned. Metal bumps 11, which are preferably made of gold, are formed on the electrode terminals. Acoustic absorbing materials 14 are formed on both sides in the SAW propagation direction by printing in order to reduce reflection of the SAW. The opposing edges of the piezoelectric substrate 12 are oblique with respect to the SAW propagation direction in order to avoid degradation of the filter characteristic due to the SAW reflected by the edges. The IDTs 13 are designed to have suitable parameter values that achieve a desired filter characteristic. Examples of such parameters are the electrode finger pitch and electrode weighting.

As shown in FIG. 3B, the SAW filter chip 1 is flip-chip mounted on a package having a four-layer structure, which is an example of the multilayer structure. The package is composed of a chip mounting base 21, an upper frame member 22, a lower frame member 25 and a lid 23. On-base interconnection or wiring lines 31, which are electrically connected to the SAW filter chip 1, are formed on the chip mounting base 21. The upper frame member 22 defines a cavity 20 in which the SAW filter chip 1 on the chip mounting base 21 is housed. The lower frame member 25 defines a cavity 30 on a side of the chip mounting base 21 opposite to the chip mounting side. The lid 23 hermetically seals the cavity 20 defined by the upper frame member 22. Preferably, the cavity 30 has a size larger than that of the surface acoustic wave filter chip 1.

Figure 4:
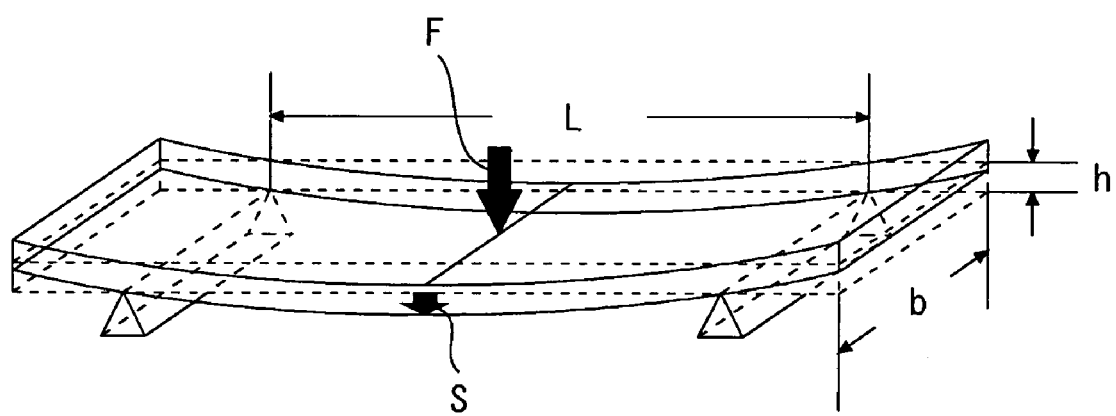
FIG. 4 is a diagram that explains the bending elastic stiffness.

The chip mounting base 21 is made of a material having a good flexibility, such as resin, and is typically a flexible printed circuit (FPC) board. Preferably, the chip mounting base 21 is a sheet as thin as 100 μm or less in order to secure sufficient flexibility. The flexibility of the chip mounting base 21 will be described later with reference to FIG. 4.

The upper frame member 22 and the lower frame member 25, that define the cavities 20 and 30, respectively, are made of a material that has a good bondability to the chip mounting base 21, and may be made of resin. The upper frame member 22 and the lower frame member 25 have the same-size bonding faces that are bonded to the chip mounting base 21. The chip mounting base 21 is sandwiched between the upper frame member 22 and the lower frame member 25 and are bonded thereto. As long as the chip mounting base 21 is sandwiched by the frames 22 and 25, the frames 22 and 25 may be varied so as to have different shapes or different sizes for bonding.

The lid 23 has a plate shape, and is made of a substrate having a good bondability to the upper frame member 22. The lid 23 may be made of resin, which may be BT resin containing bismaleimide and triazine, PPE (polyphenylether) or polyimide resin.

As described above, the SAW device 10 has the frame member 22 provided on the first surface (upper surface) of the chip mounting base 21 in order to define the cavity 20 for housing the SAW filter chip 1. That is, the frame member 22 has an opening for accommodating the SAW filter chip 1. The lid 23 hermetically seals the cavity 20 in which the SAW filter chip 1 is housed.

The on-base interconnection lines 31 are provided on the chip mounting base 21, and are connected to the metal bumps 11 of the SAW filter chip 1. The on-base interconnection lines 31 have a layout that corresponds to the positions of the metal bumps 11. The metal bumps 11 and the on-base interconnection lines 31 are mechanically and electrically connected together, so that the SAW filter chip 1 and the chip mounting base 21 can be mechanically and electrically connected together. An electrically conductive resin 51 is used to mechanically and electrically connect the metal bumps 11 and the on-base interconnection lines 31. The electrically conductive resin 51 may be more flexible than metals such as solder. The resin 51 functions to reduce stress applied to the bonding interfaces when the chip mounting base 21 is deformed.

The cavity 30 on the lower side of the chip mounting base 21 functions to allow free deforming of the chip mounting base 21. The chip mounting base 21 that supports the SAW filter chip 1 is a thin sheet-like member, and has the flexibility that prevents the chip mounting area of the board 21 from being affected by deforming of the flexible mounting board 21 caused by deformation of other members such as the members 22 and 23. That is, deformation of the flexible mounting board 21 caused by deformation of other members concentrates on positions in the vicinity of the end portions sandwiched between the upper frame member 22 and the lower frame member 25. This prevents the chip mounting area of the flexible mounting board 21 from being deformed so that the metal bumps 11 are detached from the on-base interconnection lines 31.

The above-mentioned degree of flexibility of the chip mounting base 21 may be achieved by an insulation substrate such as BT resin, polyimide resin or PPE. As compared to alumina ceramics conventionally used to mount the SAW filter chip, BT resin, polyimide resin or PPE has a very smallbending elastic stiffness.

Now, a description will be given of the bending elastic stiffness and the flexibility of the chip mounting base 21. Stress a to bending (bending stress) is defined as follows:

$$\sigma = \frac{3FL}{2bh^2} \quad (1)$$

where L is the length of the long side of the chip mounting base 21, b is the length (width) of the short side, h is the thickness, and F is force vertically applied to the center of the board 21 on the upper surface from above. Strain $\epsilon$ to bending (bending strain) is expressed as follows:

$$\varepsilon = \frac{6Sh}{L^2} \quad (2)$$

where S is the amount of deformation of the board 21.

The degree E of bending elasticity is obtained by dividing the bending stress a by the bending strain $\epsilon$, and is therefore expressed as follows:

$$E = \frac{\sigma}{\varepsilon} = \frac{3FL}{2bh^2} \times \frac{L^2}{6Sh} = \frac{FL^3}{4Sbh^3} \quad (3)$$

The unit of each length is [mm], and the unit of the bending elastic stiffness is [GPa].

Let us consider an example in which the chip mounting base 21 is made of a material of E=2~8 GPa (that corresponds to the bending elastic stiffness of BT resin or polyimide resin) and has a size of L=10 mm, h=0.1 mm (100 $\mu$m) and b=2 mm. In this case, force F applied can be calculated as 1.6~6.4×10$^{-4}$ N (1.6~6.4×10$^{-2}$ gf) when the amount S of deformation of the above chip mounting base 21 is equal to 0.01 mm (10 $\mu$m). In contrast, for the same amount S of deformation as mentioned above, the conventional board of alumina ceramics (E=314 GPa) needs force F as large as 2.5×10$^{-2}$ N (2.5 gf). That is, for the same amount S of deformation, force for the flexible mounting board 21 is approximately 1/100 of that for the conventional alumina ceramics. The extremely flexible mounting board 21 can be realized by using a material having a bending elastic stiffness of 2–8 GPa. It is also to be noted that the conventional board of alumina ceramics needs a thickness of approximately 200 $\mu$m in order to avoid certain limitations on the process and occurrence of cracking. In contrast, the flexible mounting board 21 does not need such a thickness as large as 200 $\mu$m.

Preferably, the chip mounting base 21 is 100 $\mu$m thick or less. It can be seen from equation (3) that the force F applied to the base 21 decreases as the thickness h of the chip mounting base 21 decreases. When the chip mounting base 21 is 100 $\mu$m thick or less, deformation of the board 21 concentrates on areas in the vicinity of the board supporting portions in which the board 21 is sandwiched between the upper frame member 22 and the lower frame member 25. Thus, the chip mounting area of the board 21 has less stress due to deformation of the package. More particularly, the chip mounting base 21 is 80 $\mu$m thick or less. This enables a wider degree of freedom in choosing material suitable for the chip mounting base 21. That is, a material having a larger bending elastic stiffness may be chosen for the board 21.

When the chip mounting base 21 is 50 $\mu$m thick, preferably, the SAW device 10 has a size such that the package thereof is 10.8 mm long, 3.8 mm wide and 600 $\mu$m thick. In this case, the cavity 20 has a size such that it is 9.2 mm long, 2.2 mm wide and 0.5 mm high.

Turning now to FIGS. 3A through 3D, other structural elements will be described below. As shown in FIG. 3C, the on-base interconnection lines 31 on the chip mounting base 21 are connected to the terminals 33 disposed on the lower surface of the lower frame member 25 through via interconnections 32 that penetrate through the chip mounting base 21 and the lower frame member 25. The terminals 33 are formed by a metal pattern, which serves as terminals for making external connections. A signal is input to and output from the SAW filter chip 1 via the terminals 33, which include ground terminals for grounding the package and the SAW filter chip 1.

It is preferable to arrange the terminals 33 in the midsections on the opposing long sides of the lower frame member 25 in a concentrated manner, as shown in FIG. 3D. For example, the terminals 33 are arranged so as to have a center-to-center distance of 1.27 mm. The concentrated arrangement of the terminals 33 improves the electrical characteristics of the SAW device 10 and restrains deformation thereof due to deformation of a parts mounting board 41 (see FIG. 5).

As shown in FIG. 5, the SAW device 10 thus packaged may be mounted on the parts mounting board 41 on which on-board interconnection lines or pads 42 are provided. The terminals 33 of the SAW device 10 are connected to the on-board interconnection lines 42 by solder layers 43, so that the SAW device 10 and the parts mounting board 41 are electrically and mechanically connected together. In soldering, a reflow process may be employed. In this case, the metal bumps 11 on the SAW filter chip 1 are preferably made of gold in order to avoid failures by heating.

FIG. 5 also shows a distortion of the SAW device 10 caused by the bending test on the parts mounting board 41. When the parts mounting board 41 is bent, the lower frame member 25 is deformed which is connected to the board 41 through the on-board interconnection lines 42, the solder layers 43 and the terminals 33. This deformation causes the flexible mounting board 21 to be deformed. The flexibility of the board 21 causes stress to concentrate on the areas in the vicinity of the flexible board supporting portions, and avoids the occurrence of considerable stress in the chip mounting area. Thus, the SAW device 10 is highly reliable for the bending test. Preferably, the metal bumps 11 are located further in than the flexible board supporting portions in which the board 21 is sandwiched between the upper frame member 22 and the lower frame member 25 in order to reduce stress applied to the interfaces between the metal bumps 11 and the flexible board 21.

A description will now be given of a method of fabricating the SAW device 10 with reference to FIGS. 6A through 6D. The step of FIG. 6A produces the flexible mounting board 21 on which the on-base interconnection lines 31 are formed. The board 21 is, for example, 50 μm thick. Preferably, the on-base interconnection lines 31 are disposed in the midsection so that the SAW filter chip 1 may be mounted in the center of the flexible board 21. In other words, the on-base interconnection lines 31 are arranged so that the SAW filter chip 1 can be located in the center of the cavity 20 defined by the upper frame member 22. The via interconnections 32 (see FIG. 3C) are formed in the flexible mounting board 21 beforehand.

Figure 6A:
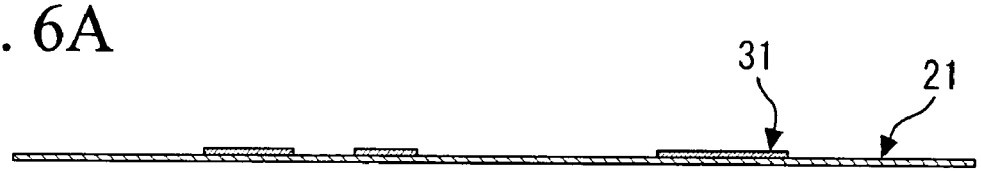
FIGS. 6A, 6B, 6C, and 6D are diagrams showing a process of fabricating the SAW device according to the first embodiment of the present invention.
Figure 6B:
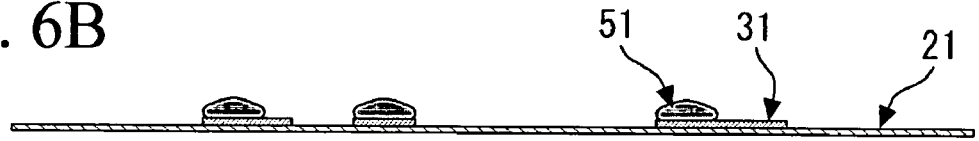
Figure 6C:
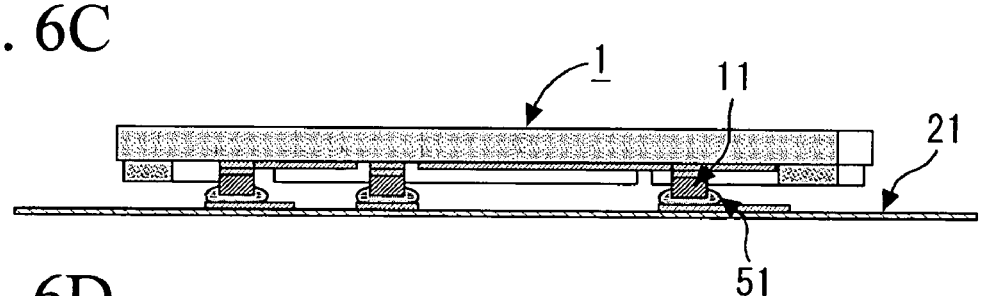
Figure 6D:
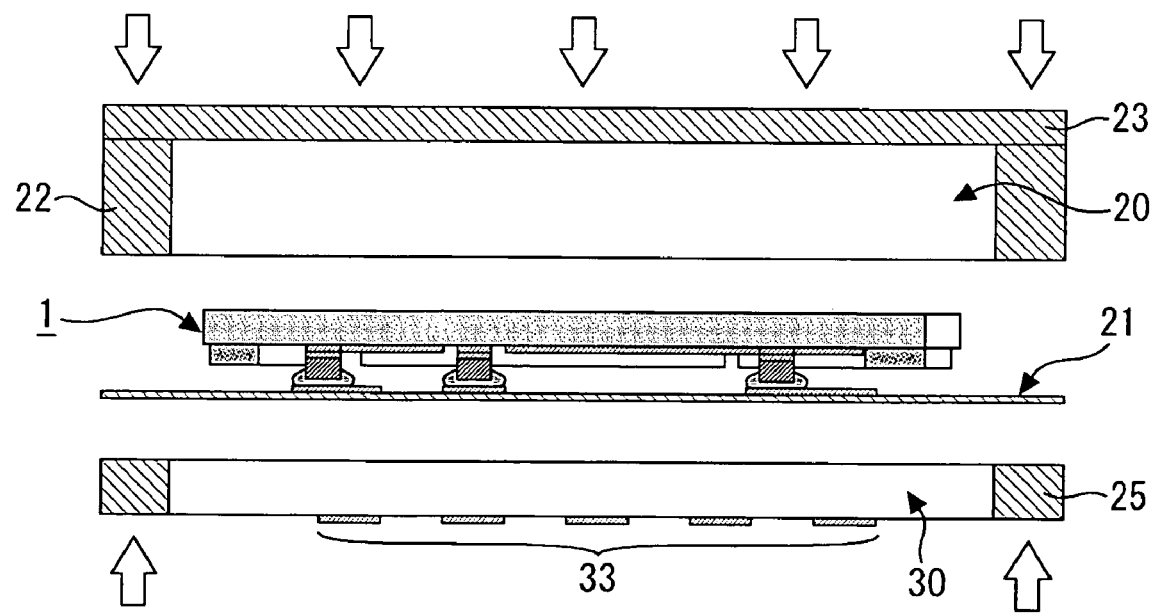

Next, as shown in FIG. 6B, the conductive resin 51 is formed at the positions at which the metal bumps 11 of the SAW filter chip 1 are to be located. The conductive resin 51 may be formed by screen printing. Then, as shown in FIG. 6C, the SAW filter chip 1 is flip-chip bonded on the flexible mounting board 21.

The lower frame member 25 that has the via interconnections 32 and the terminals 33 is disposed on the lower side or backside of the flexible board 25, while the upper frame member 22 is disposed on the upper side of the board 21. Further, the lid 23 is attached to the top of the upper frame member 22. Then, the lower frame member 25, the board 21, the upper frame member 22 and the lid 23 thus laminated are pressurized from both sides while being heated, and are thus joined together. Alternatively, the upper frame member 22 and the lid may be bonded beforehand, so that the process of FIG. 6D may be simplified.

It is to be noted that FIGS. 6A through 6D are directed to the single SAW device 10. However, many SAW devices 10 may be produced simultaneously. This uses multiple-parts-arranged substrates, each of which has a two-dimensional arrangement of parts. For example, the flexible mounting boards 21 are arranged on the multiple-parts-arranged substrate in matrix formation. Similarly, the multiple-parts-arranged substrates are prepared for the upper frame substrate 22, the lower frame substrate 25 and the lid 23. These substrates are joined together, so that the resultant laminate has many SAW devices 10. Then, the laminate is separated into the individual SAW devices 10 by using laser. Instead of laser, a rotary cutting blade or press-cutting blade may be used. The use of multiple-parts-arranged substrates contributes cost reduction.

Figure 7A:
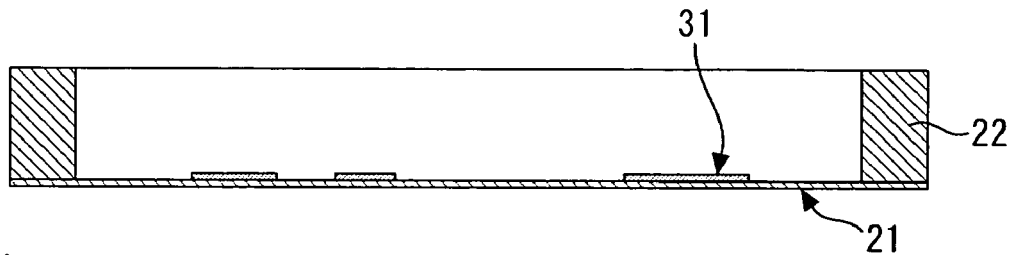
FIGS. 7A, 7B, 7C and 7D are diagrams showing another process of fabricating the SAW device according to the first embodiment of the present invention.
Figure 7B:
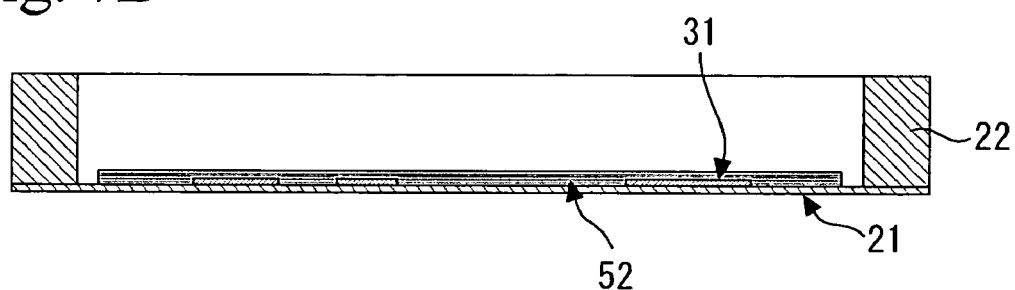

Another method of fabricating the SAW device 10 will now be described with reference to FIGS. 7A through 7D. As shown in FIG. 7A, the cavity 20 is defined by attaching the upper frame member 22 to the upper surface of the flexible mounting board 21 in advance of mounting the SAW filter chip 1 on the flexible board 21. Thus, the strength of the flexible mounting board 21 can be reinforced and easy transportation thereof can be achieved. The via interconnections 32 (see FIG. 3D) are formed in the flexible mounting board 21 before the attachment.

Figure 7C:
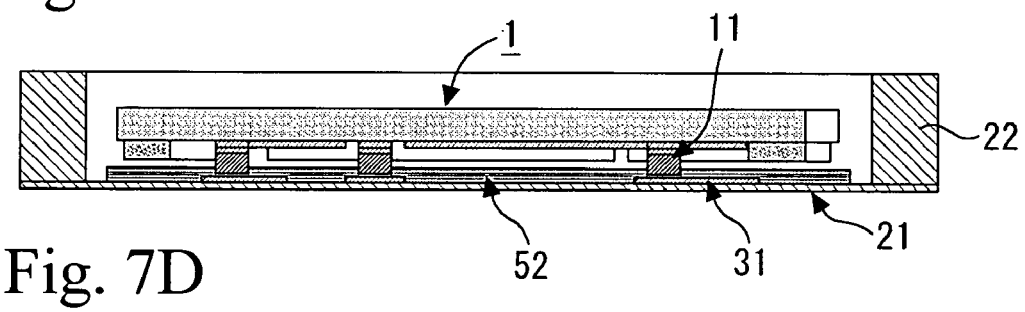
Figure 7D:
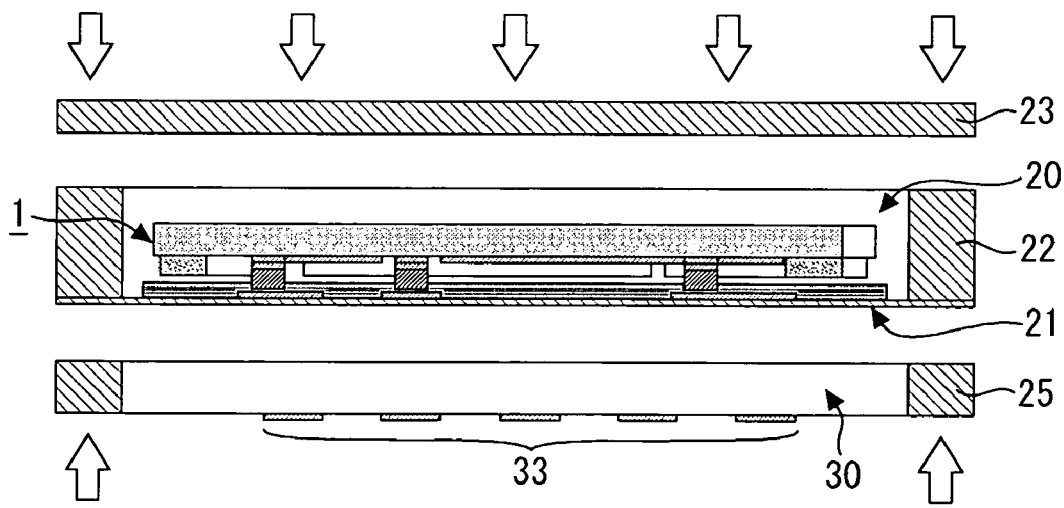

The advance attachment of the upper frame member 22 makes it difficult to deposit the conductive resin 51 on the on-base interconnection lines 31 of the flexible mounting board 21 by screen printing. Taking the above into consideration, the present method employs a process of FIG. 7B in which an electrically anisotropic sheet 52 is dropped into the cavity 20 and is placed on the flexible mounting board 21. Then, as shown in FIG. 7C, the SAW filter chip 1 is bonded to the sheet 52.

Then, the lower frame member 25 that has the via interconnections 32 and the terminals 33 is disposed on the lower surface of the flexible mounting board 21, and the lid 23 is disposed on the top of the upper frame member 22. The laminate thus formed is pressurized from both sides while being heated, and is thus fixed. In this manner, the SAW device 10 can be fabricated.

As described above, the flexibility of the chip mounting base 21 functions to reduce stress applied to the interfaces between the SAW filter chip 1 and the package. Thus, even when the board 21 is deformed, a connection failure can be avoided. Thus, the SAW device 1 has high mounting reliability.

(Second Embodiment)

Figure 8A:
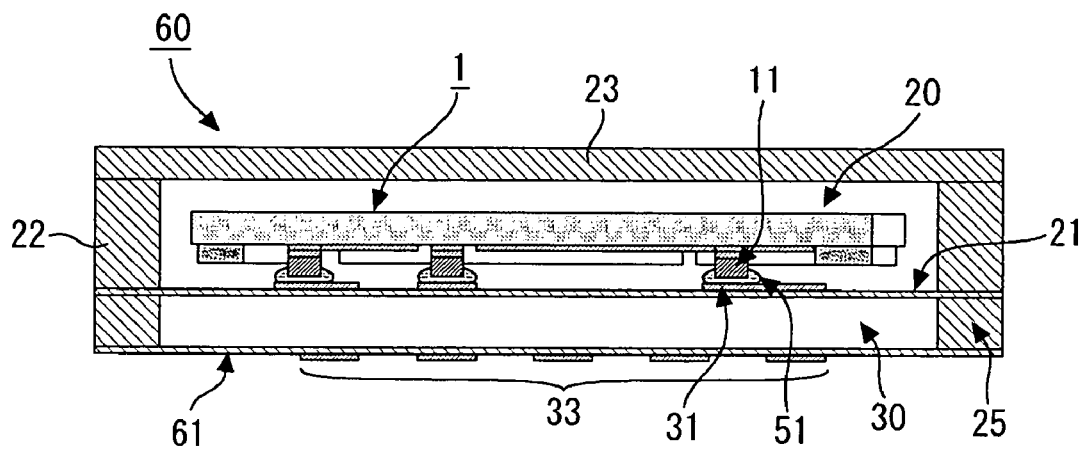
FIGS. 8A, 8B and 8C are respectively cross-sectional views of other SAW devices according to a second embodiment of the present invention.
Figure 8B:
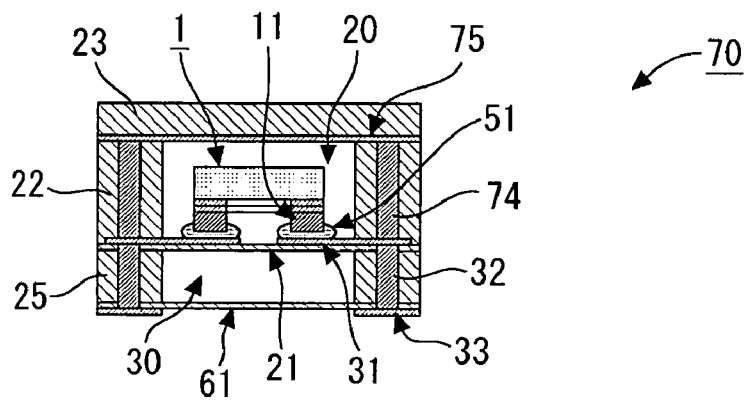
Figure 8C:
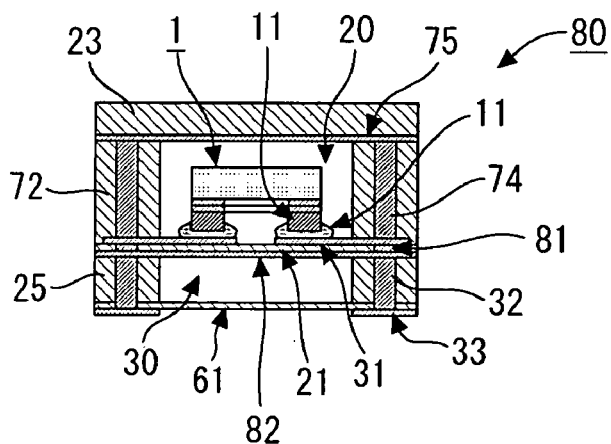

FIGS. 8A through 8C show SAW devices 60, 70 and 80 according to a second embodiment of the present invention. In these figures, the same elements as those shown in the previously described figures are denoted by the same reference numerals, and a description thereof will be omitted.

FIG. 8A is a cross-sectional view of the SAW device 60 taken along the same line as the line A—A shown in FIG. 3A. The cross-section of FIG. 8A corresponds to that of FIG. 3B. A plate-like lid board 61 is attached to the lower surface of the lower frame member 25 of the SAW device 10. The lid board 61 hermetically seals the cavity 30. The lid board 61 may be a sheet-like resin board. The thickness of the lid board 61 is a design choice. When the lid board 61 is relatively thin, the SAW device 60 may be downsized. When the lid board 61 is relatively thick, the SAW device 60 is resistant to deforming.

The lid board 61 that covers the chip mounting base 21 prevents external shock from being applied thereto. The terminals 33 are provided on the bottom surface of the lid board 61. The via interconnections 32 employed in the SAW device 60 penetrate through the lid board 61 and make electrical connections with the on-base interconnection lines 31. The rest of the SAW device 60 is the same as that of the SAW device 10. In the process of fabricating the SAW device 60, the lid board 61 is pressurized together with the other members in the step of FIG. 6D or FIG. 7D.

FIG. 8B is a cross-sectional view of the SAW device 70 taken along the same line as the line B—B shown in FIG. 3B. A planar pattern 75 made of an electrically conductive material is provided on the entire backside or lower surface of the lid 23 in the structure of the SAW device 10. The planar pattern 75 is electrically connected, through the via interconnections 74, to the on-base interconnection lines 31 and the terminals 33 connected thereto.

The planar pattern 75, which is grounded via the terminals 33, electrically shields the SAW filter chip 1 from external noise. In this regard, the planar pattern 75 is a shield member. The planar pattern 75 forms a ground plane or ground potential above the SAW filter chip 1 in the cavity 20, so that the SAW filter chip 1 is operatively stabilized. The rest of the structure of the SAW device 70 is the same as that of the SAW device 10. In the fabrication process, the inner or bottom surface of the lid 23 is metallized in advance of the heat-applied pressurizing.

FIG. 8C is a cross-sectional view of the SAW device 80 taken along the same line as the line B—B shown in FIG. 3B. The SAW device 80 has a planar pattern 82 provided above the cavity 30 in addition to the upper planar pattern 75 mentioned above. The SAW filter chip 1 is thus protected electrically from the upper and lower sides of the SAW device 10.

The planar pattern 82 is provided on the entire lower surface of the flexible chip mounting base 21. The planar pattern 82 is electrically connected to the on-base interconnection lines 31 trough the via interconnections 81 that penetrate through the chip mounting base 21, and are also connected to the terminals 33 through the via interconnections 32 that penetrate through the lower frame member 25.

The planar pattern 82, which is grounded via the terminals 33, electrically shields the SAW filter chip 1 from external noise. The planar pattern 82 forms a ground plane or ground potential below the SAW filter chip 1 in the cavity 30, so that the SAW filter chip 1 is operatively stabilized. The planar pattern 82 may be provided on the upper surface of the chip mounting base 21. In this case, an insulating layer is provided at the interfaces between the on-base interconnection lines 31 and the planar pattern 82. The rest of the structure of the SAW device 80 is the same as that of the SAW device 10. In the fabrication process, the inner or bottom surface of the lid 23 is metallized and the lower surface of the chip mounting base 21 is also metallized in advance of the heat-applied pressurizing.

(Third Embodiment)

A description will now be given of a SAW device 90 according to the third embodiment of the present invention, in which parts that are the same as those shown in the previously described figures are given the same reference numerals. The lower frame member 25 that is used for defining the cavity 30 in the first embodiment is omitted in the third embodiment.

Figure 9A:
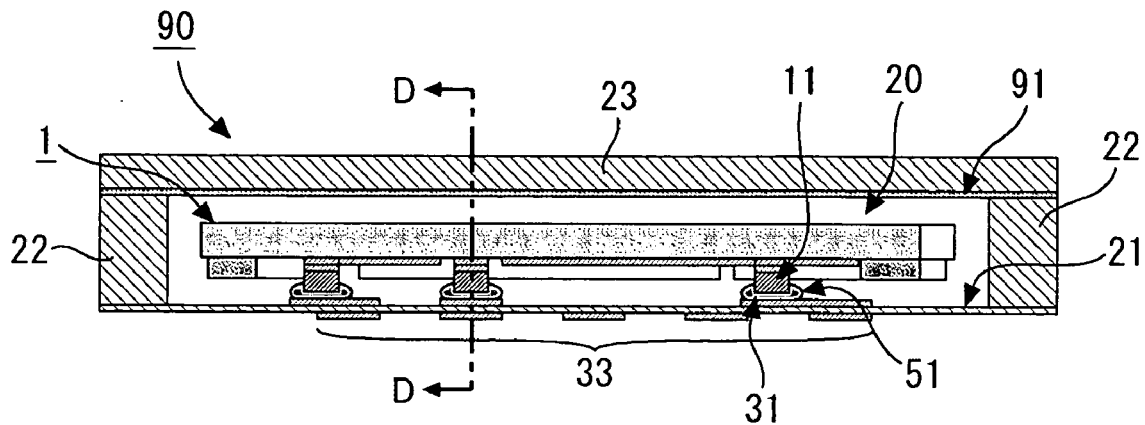
FIG. 9A is a cross-sectional view of a SAW device according to a third embodiment of the present invention taken along a line C—C shown in FIGS. 9B and 9C.
Figure 9B:
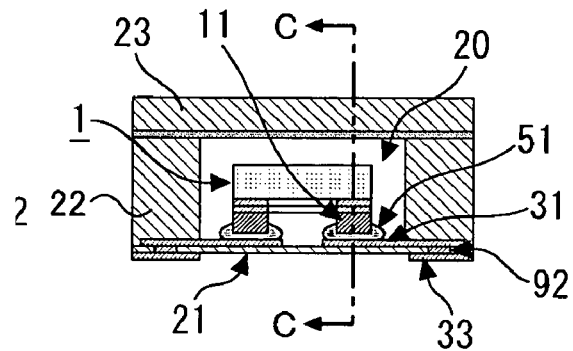
FIG. 9B is a cross-sectional view taken along a line D—D shown in FIG. 9A.
Figure 9C:
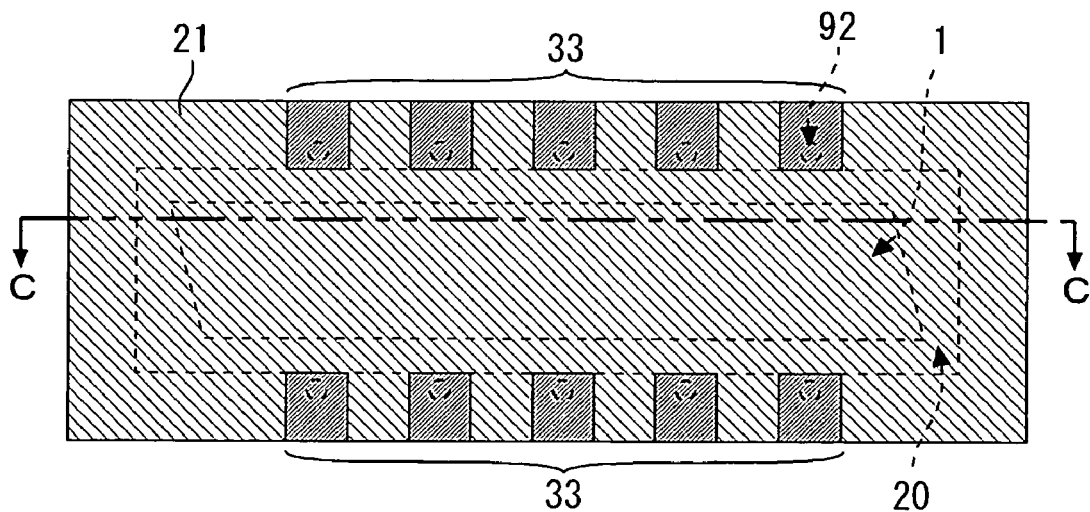
FIG. 9C is a bottom view of the SAW device shown in FIGS. 9A and 9B

FIG. 9A is a cross-sectional view of the SAW device 90 taken along lines C—C shown in FIGS. 9B and 9C, FIG. 9B is a cross-sectional view taken along a line D—D shown in FIG. 9A, and FIG. 9C is a bottom view of the SAW device 90. In these figures, the previously described elements are given the same reference numerals.

The SAW filter chip 1 is flip-chip mounted on a two-layer package composed of the flexible chip mounting base 21 and the upper frame member 22. The terminals 33 are provided on the lower surface of the chip mounting base 21, and are electrically connected to the on-base interconnection lines 31 by means of via interconnections 92 that penetrate through the board 21, as shown in FIGS. 9B and 9C.

Figure 10:
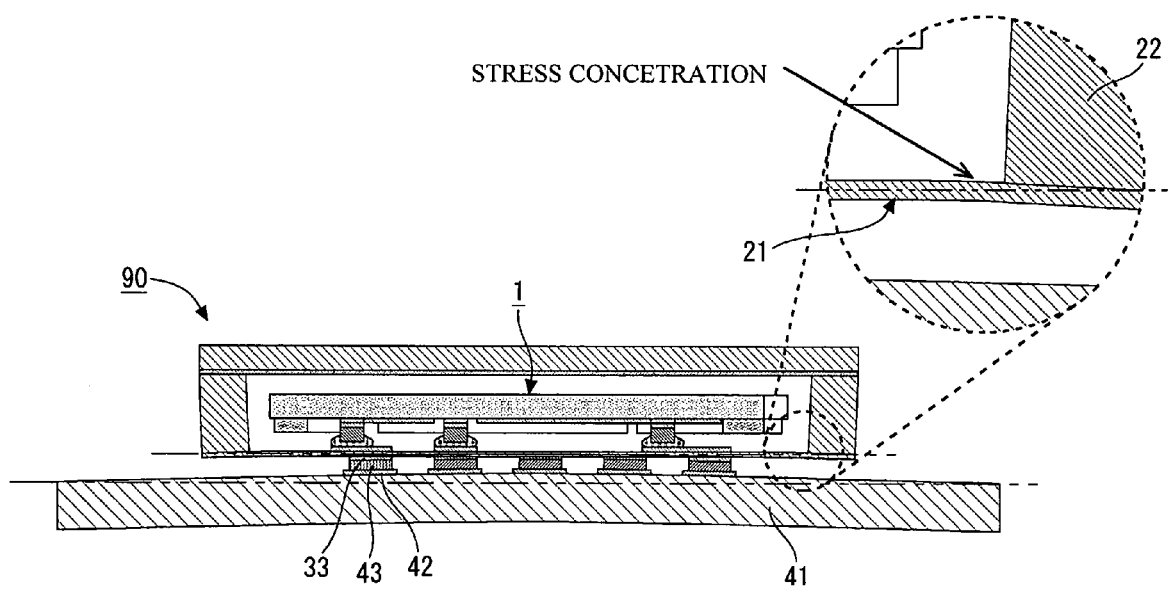
FIG. 10 is a diagram that explains effects of the third embodiment brought about when a parts mounting board on which the SAW device is mounted is subject to the board bending test.

As is shown in FIG. 10, the SAW device 90 thus packaged may be mounted on the parts mounting board 41 on which the on-board interconnection lines or pads 42 are provided. The terminals 33 of the SAW device 90 are connected to the on-board interconnection lines 42 by solder layers 43, so that the SAW device 90 and the parts mounting board 41 are electrically and mechanically connected together.

In the bending test on the SAW device 90, the parts mounting board 41 is bent, so that the chip mounting base 21 and the upper frame member 22 are thus deformed. The chip mounting base 21 to which the upper frame member 22 is attached is connected to the board 41 through the on-board interconnection lines 42, the solder layers 43 and the terminals 33. The flexibility of the board 21 causes stress to concentrate on the areas in the vicinity of the flexible board supporting portions, and prevents considerable stress from occurring in the chip mounting area, as shown in FIG. 10. Thus, the SAW device 90 has high reliability in the bending test. Preferably, the metal bumps 11 are located further in than the flexible board supporting portions in which the board 21 is attached to the upper frame member 22 in order to reduce stress applied to the interfaces between the metal bumps 11 and the flexible board 21.

A description will now be given of the method of fabricating the SAW device 90 with reference to FIGS. 11A through 11D. The step of FIG. 11A produces the flexible mounting board 21 on which the on-base interconnection lines 31 are formed. The board 21 is, for example, 50 $\mu$m thick. Preferably, the on-base interconnection lines 31 are disposed in the midsection so that the SAW filter chip 1 may be mounted in the center of the flexible board 21. In other words, the on-base interconnection lines 31 are arranged so that the SAW filter chip 1 can be located in the center of the cavity 20 defined by the upper frame member 22. The via interconnections 92 (see FIGS. 9B and 9C) are formed in the flexible mounting board 21 beforehand.

Figure 11A:
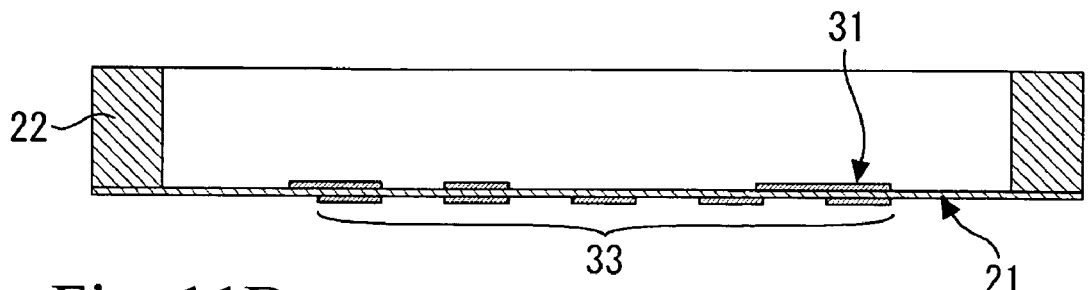
FIGS. 11A, 11B, 11C and 11D are respectively diagrams that show a process of fabricating the SAW device according to the third embodiment of the present invention.
Figure 11B:
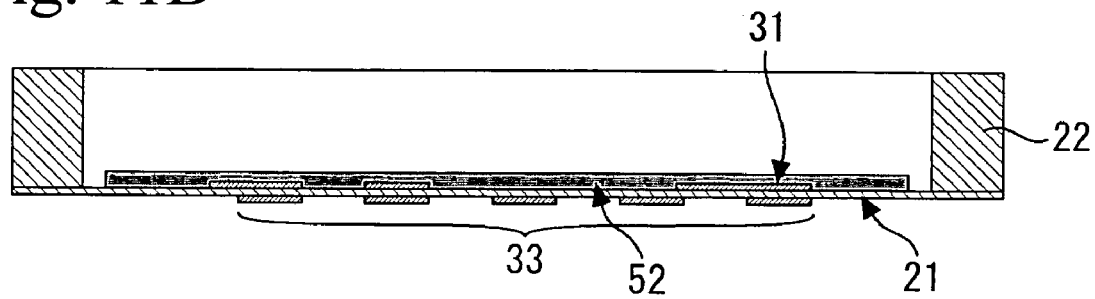
Figure 11C:
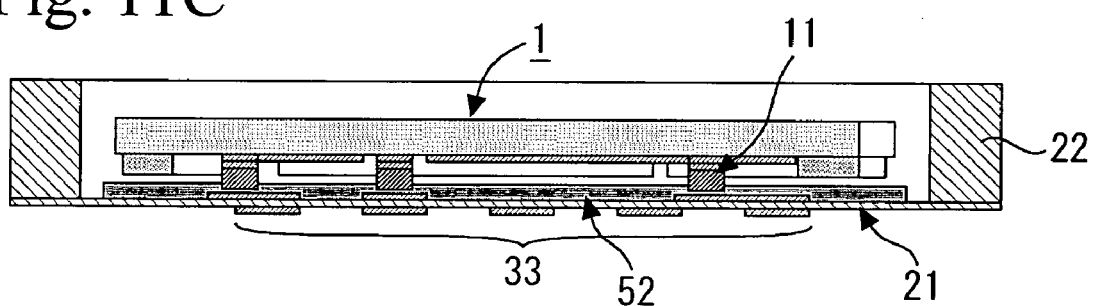

Next, as shown in FIG. 11B, the electrically anisotropic conductive sheet 52 is dropped into the cavity 20 and is placed on the flexible mounting board 21. Then, as shown in FIG. 10C, the SAW filter chip 1 is bonded to the sheet 52. The steps shown in FIGS. 11A through 11C are the same as those shown in FIGS. 6A through 6C.

Figure 11D:
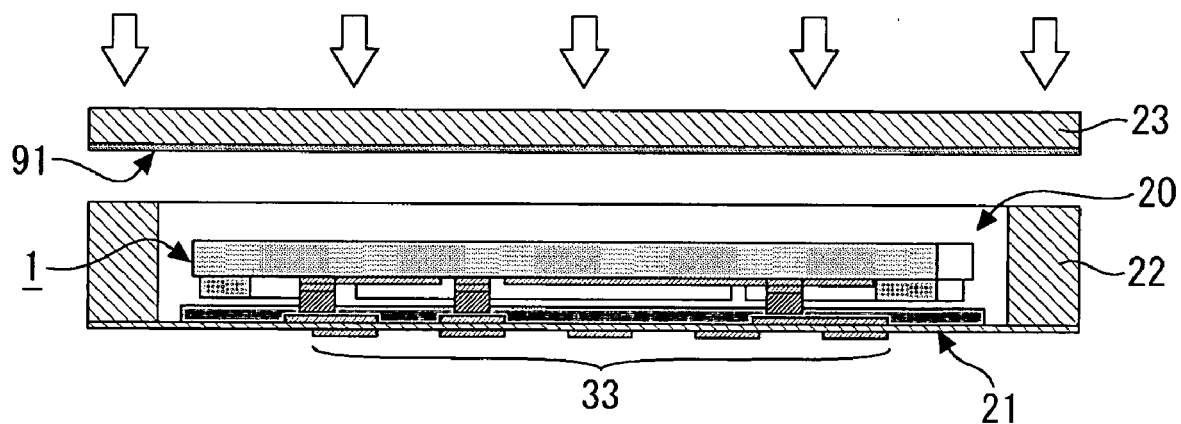

Then, as shown in FIG. 11D, the lid 23 having the bottom surface with which an adhesive sheet 91 is coated is attached to the top of the upper frame member 22. In this manner, the SAW device 90 can be fabricated. Alternatively, the SAW device 90 may be fabricated in a manner similar to that shown in FIGS. 6A through 6D.

(Fourth Embodiment)

A description will now be given of a fourth embodiment of the present invention. The fourth embodiment differs from the first embodiment in that the terminals 33 are disposed along the short-side edges of the SAW device. It is to be noted that the first embodiment has the terminals 33 arranged along the long-side edges of the device. In the following, the like reference numerals refer to like elements. Parts of the fourth embodiment that will be particularly described in the following are the same as those of any of the first through third embodiments.

Figure 12A:
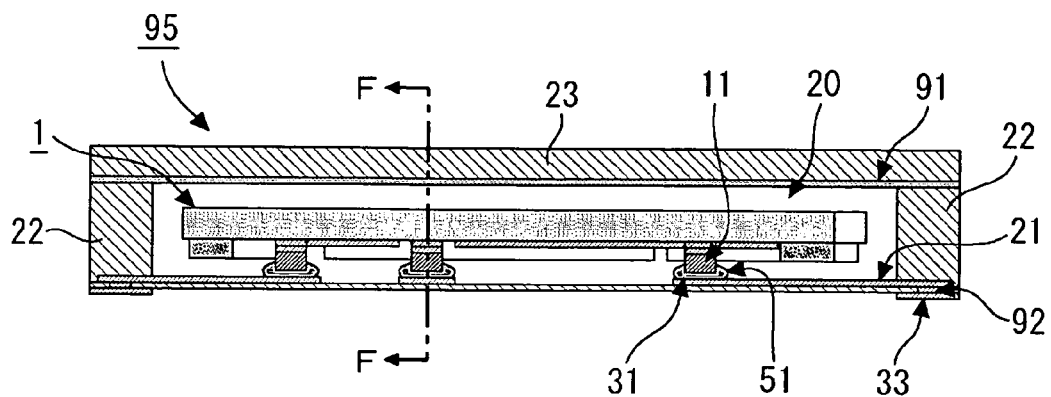
FIG. 12A is a cross-sectional view of a SAW device according to a fourth embodiment of the present invention taken along a line E—E shown in FIGS. 12B and 12C.
Figure 12B:
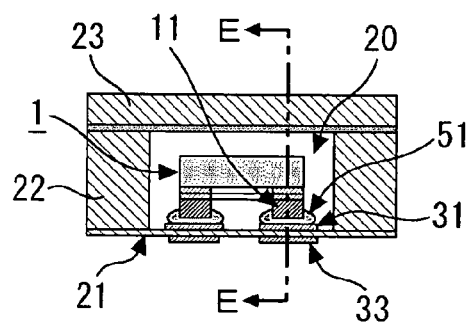
FIG. 12B is a cross-sectional view taken along a line E—E shown in FIGS. 12A and 12C.
Figure 12C:
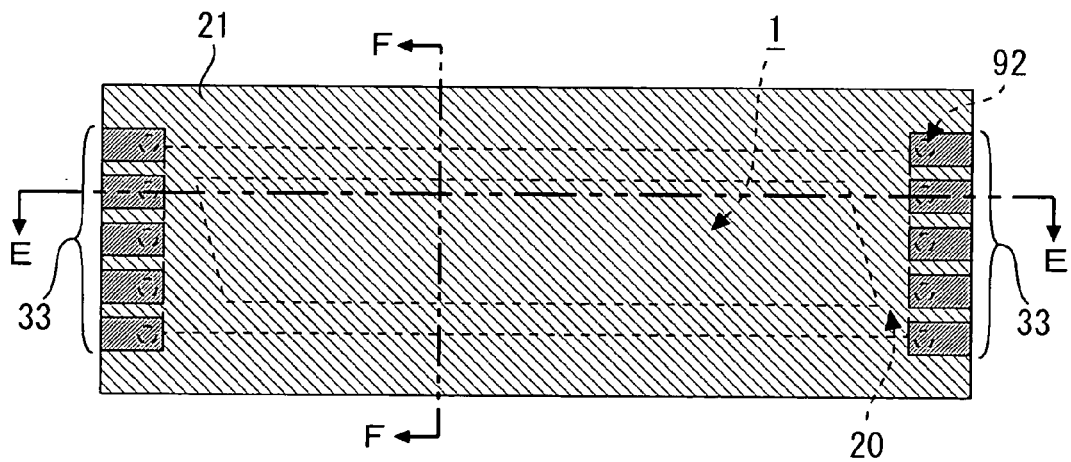
FIG. 12C is a bottom view of the SAW device shown in FIGS. 12A and 12B.

FIG. 12A is a cross-sectional view of a SAW device 95 according to the present invention taken along a line E—E shown in FIGS. 12B and 12C, FIG. 12B is a cross-sectional view taken along a line F—F shown in FIGS. 12A and 12C, and FIG. 12C is a bottom view of the SAW device 95.

The terminals 33 are arranged in the midsections along the short-side edges of the SAW device 95. Preferably, the on-base interconnection lines 31 are arranged close to the short sides of the chip mounting base 21 in order to easily make contacts with the terminals 33.

Figure 13:
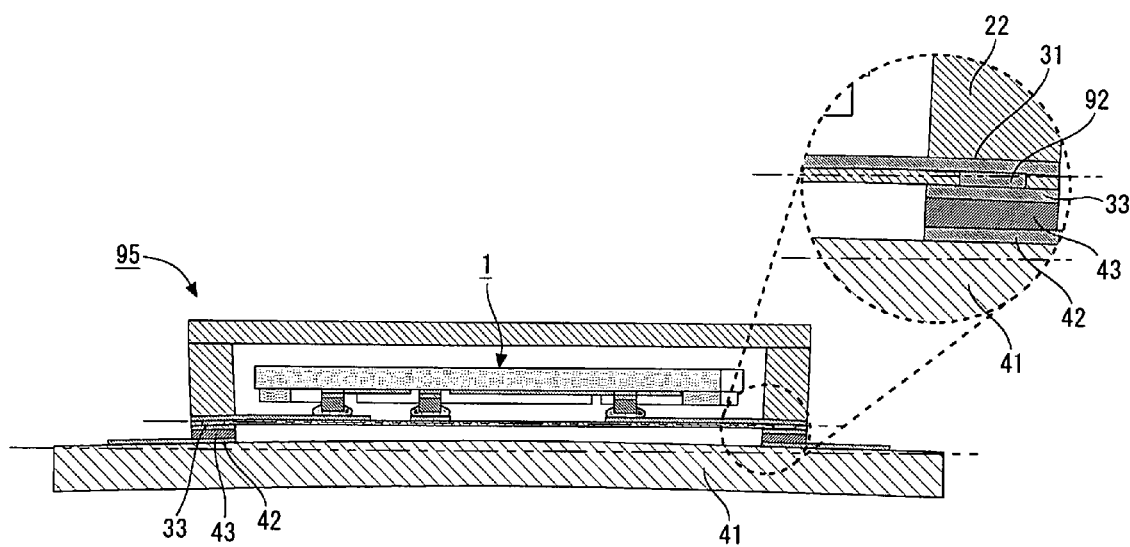
FIG. 13 is a diagram that explains effects of the fourth embodiment brought about when a parts mounting board on which the SAW device is mounted is subject to the board bending test.

FIG. 13 shows a bending test on the SAW device 95 mounted on the parts mounting board 41. When the parts mounting board 41 is bent, the chip mounting base 21 and the upper frame member 22 attached thereto are deformed. The chip mounting base 21 is connected to the parts mounting board 41 through the on-board interconnection lines 42, the solder layers 43 and the terminals 33. Due to the flexibility of the chip mounting base 21, stress concentrates on the portions of the board 21 in the vicinity of the fixed portions with the solder layers 43. Thus, the chip mounting area of the board 21 receives less stress.

(Fifth Embodiment)

Figure 14A:
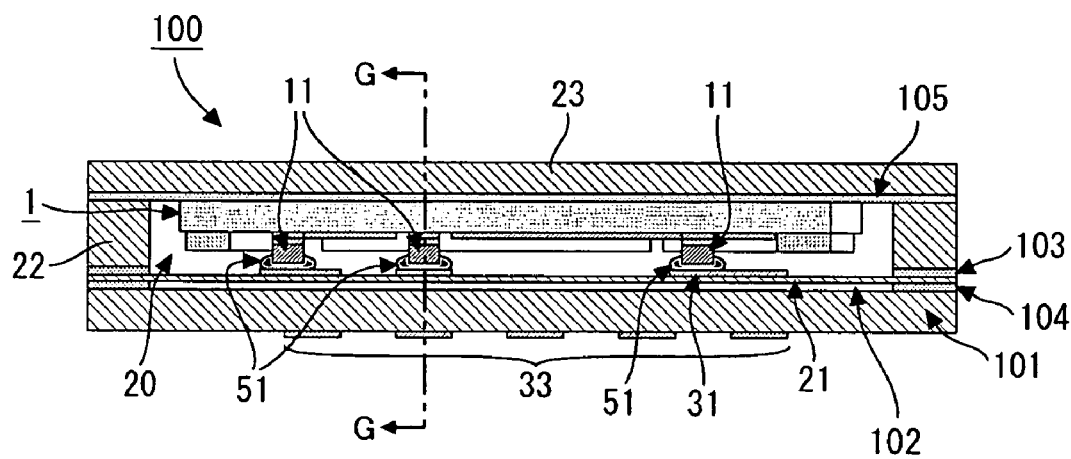
FIG. 14A is a cross-sectional view of a SAW device according to a fifth embodiment of the present invention taken along a line H—H shown in FIGS. 14B and 14C.
Figure 14B:
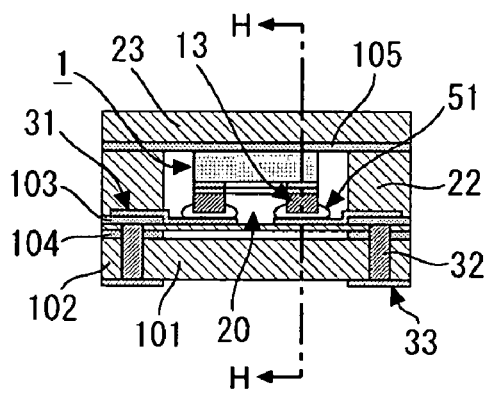
FIG. 14B is a cross-sectional view taken along a line G—G shown in FIG. 14A.
Figure 14C:
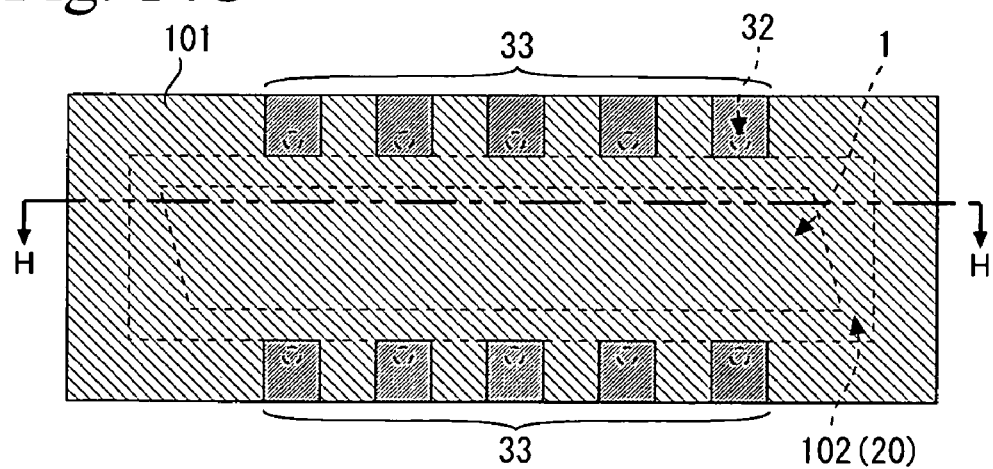
FIG. 14C is a bottom view of the SAW device shown in FIGS. 14A and 14B.

FIG. 14A is a cross-sectional view of a SAW device 100 according to a fifth embodiment of the present invention taken along a line H—H shown in FIGS. 14B and 14C, FIG. 14B is a cross-sectional view taken along a line G—G shown in FIG. 14A, and FIG. 14C is a bottom view of the SAW device 100. In these figures, parts that are the same as those shown in the previously described figures are given the same reference numerals. The SAW device 100 has the SAW filter chip 1 designed to handle the TV intermediate frequency band as in the case of the first through fourth embodiments of the invention.

As is shown in FIG. 14A, the SAW filter chip 1 is flip-chip bonded to a multi-layer package, which has the following structure. The package is made up of the flexible chip mounting base 21, the upper frame member 22, an adhesive layer 103, a lower board 101, an adhesive layer 104, and the lid 23. The adhesive layer 103 joins the chip mounting base 21 and the upper frame member 22. The adhesive layer 104 defines a narrow cavity 102 on the side opposite to the chip mounting side of the board 21, and joins the board 21 and the lower board 101. The flexible chip mounting base 21 may be an FPC that is a resin board, and is preferably a sheet that is 100 μm thick or less. The upper frame member 22 may be made of resin.

The lower board 101 faces the lower surface of the chip mounting base 21 through the narrow cavity 102. The lower board 101 has a plate shape and is made of resin, for example. The narrow cavity 102 allows the flexible chip mounting base 21 to be deformed. However, if the chip mounting base is excessively deformed due to external shock, an interface failure may occur between the metal bumps 11 and the on-base interconnection lines 31 (including the conductive resin 51). The lower board 101 restricts deforming of the chip mounting base 21. For example, the chip mounting base 21 and the lower board 101 are spaced at an interval of, for example, 40 μm. Of course, the interval may be adequately selected as long as excessive deforming of the chip mounting base 21 can be blocked. The narrow cavity 102 depends on the thickness of the adhesive layer 104. If the chip mounting base 21 and the lower board 101 are deformed independently, the narrow cavity 102 may be omitted. In this case, the lower board 101 will contact the chip mounting base 21.

The lower board 101 is attached to the chip mounting base 21 at positions outside of the chip mounting area. Thus, the adhesive layer 104 is provided to the periphery outside of the chip mounting area. The adhesive layer 104 is made of an adhesive such as resin. The adhesive layer 104 serves as a spacer as well as the adhesive member.

The chip mounting area of the board 21 is not fixed to the lower board 101 but is free to move. This allows the board 21 to be deformed when the package is deformed due to external stress. Thus, less stress is applied to the electrical connections between the SAW filter chip 1 and the chip mounting base 21, so that the SAW device 100 is highly reliable.

The lid 23, which may be a resin plate, is attached to the frame member 22 with an adhesive layer 105. The adhesive layer 105 may be used to bond the lid 23 to the backside of the SAW filter chip 1 opposite to the front side on which the IDTs 13 are formed. The lid 23 may be less deformed than the frame member 22 and the lower board 101. The SAW filter chip 1 supported by the lid 23 has good positional stability. Thus, the stability for the bending test and external shock can be further improved.

The on-base interconnection lines 31 on the chip mounting base 21 are connected to the metal bumps 11 of the SAW filter chip 1. The on-base interconnection lines 31 have a layout that corresponds to the positions of the metal bumps 11. The metal bumps 11 and the on-base interconnection lines 31 are mechanically and electrically connected together, so that the SAW filter chip 1 and the chip mounting base 21 can be mechanically and electrically connected together. The electrically conductive resin 51 may be used to mechanically and electrically connect the metal bumps 11 and the on-base interconnection lines 31.

As shown in FIG. 14B, the on-base interconnection lines 31 on the flexible mounting board 21 are connected to the terminals 33 disposed on the lower surface of the lower board 101 by means of the via interconnections 32 that penetrate through the flexible board 21 and the lower board 101 (including the adhesive layers 103 and 104). The terminals 33 used to make external connections are arranged in the midsections along the long-side edges of the lower board 101, as shown in FIG. 14C. Alternatively, the terminals 33 may be arranged along the short-side edges of the lower board 101.

The SAW device 100 thus packaged may be mounted on the parts mounting board 41. The solder layers 43 bond the terminals 33 and the on-board interconnection lines 42 together. The solder reflow process may be employed in bonding. In this case, the metal bumps 11 are preferably made of gold.

Figure 15:
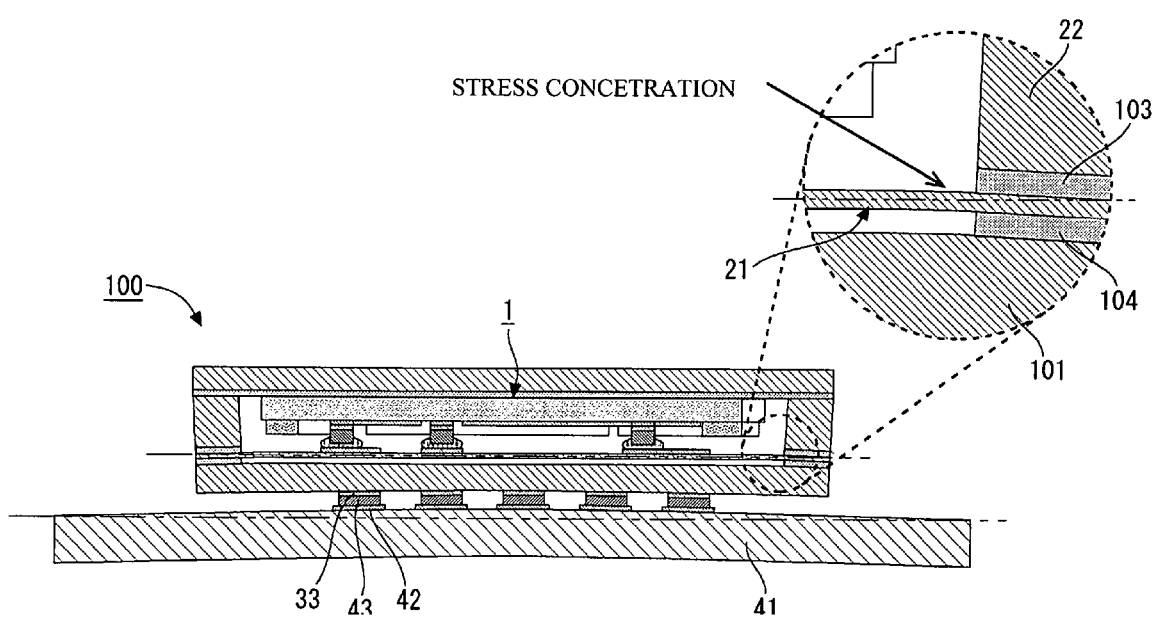
FIG. 15 is a diagram that explains effects of the fifth embodiment brought about when a parts mounting board on which the SAW device is mounted is subject to the board bending test.

FIG. 15 also shows a distortion of the SAW device 100 caused by the bending test in which the parts mounting board 41 is bent. As is shown in FIG. 15, when the parts mounting board 41 is bent, the lower board 101 is thus deformed which is connected to the board 41 via the terminals 33, the solder layers 43 and the terminals 33. Due to deforming of the board 101, the flexible chip mounting base 21 is deformed. However, the flexibility of the board 21 avoids stress concentration on the chip mounting area thereof due to deforming. Thus, the SAW device 100 mounted on the parts mounting board 41 is highly reliable. Preferably, the supporting portions in which the board 21 is sandwiched between the frame member 22 and the lower board 101 are positioned outside of the metal bumps 11 attached to the SAW filter chip 1 in order to prevent considerable stress from being applied to the interfaces between the metal bumps 11 and the flexible chip mounting base 21.

The backside of the SAW filter chip 1 is attached to the lid 23 with adhesive. Thus, even if the SAW filter chip 1 drops and receives an external shock, the lid 23 functions to absorb most of the external shock, so that the interfaces between the metal bumps 11 and the chip mounting base 21 can be protected from the external shock. Thus, the SAW device 100 is highly reliable.

Figure 16A:
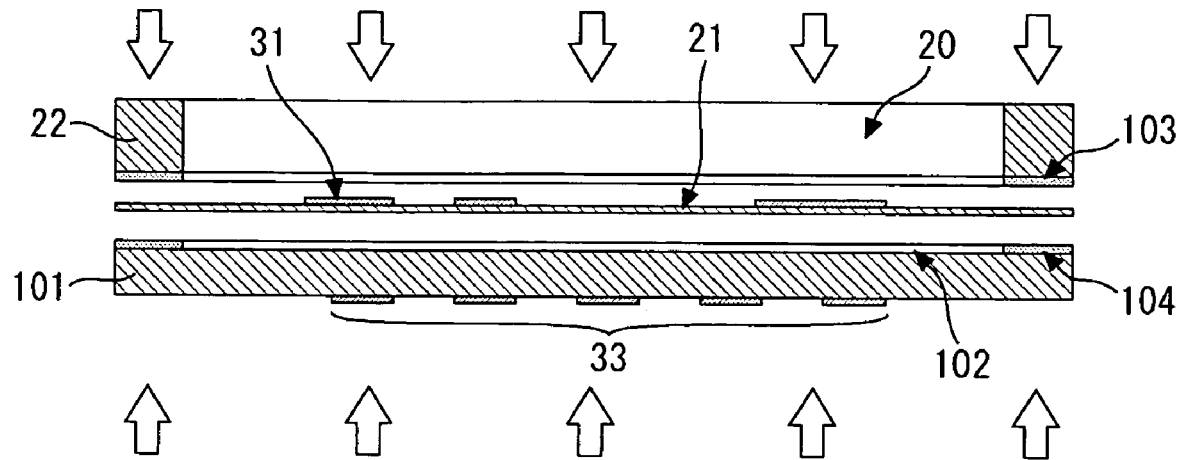
FIGS. 16A, 16B and 16C are respectively diagrams that show a process of fabricating the SAW device according to the fifth embodiment of the present invention.

The method of fabricating the SAW device 100 will now be described with reference to FIGS. 16A through 16C. As shown in FIG. 16A, the frame member 22 with the adhesive layer 103 is coated is disposed on the upper surface of the chip mounting base 21 with the on-base interconnection lines 31 and the via interconnections 32. Further, the lower board 101 with the adhesive layer 104, the terminals 33 and the via interconnections 32 is disposed on the lower surface of the chip mounting base 21. Then, the laminate thus formed is pressurized from both sides while being heated, so that the frame member 22 and the lower board 101 are joined to the chip mounting base 21.

Figure 16B:
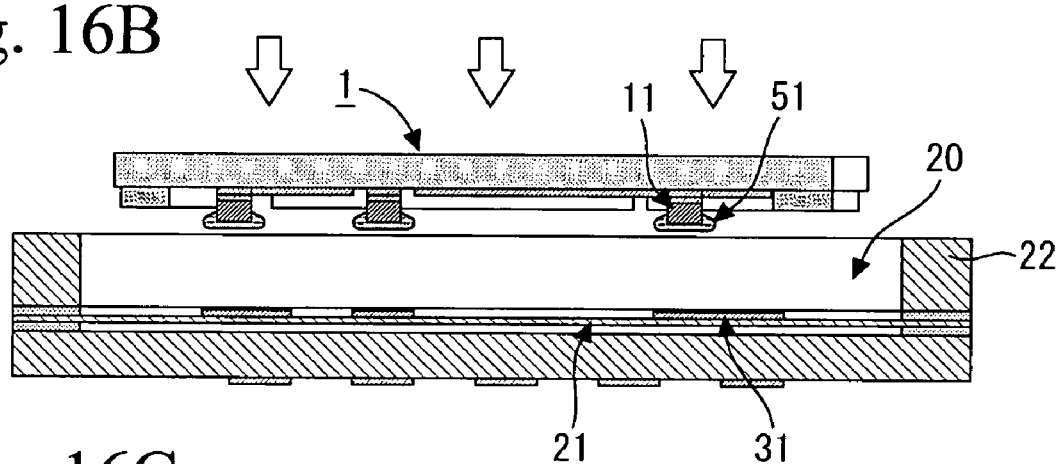

Next, as shown in FIG. 16B, the SAW filter chip 1 in which the metal bumps 11 are coated with the conductive resin 51 is housed in the cavity 20 in the face-down fashion, and is flip-chip bonded to the on-base interconnection lines 31. The conductive resin 51 may be transferred, by a squeegee, to the metal bumps 11 from an electrically conductive adhesive layer regulated at a fixed thickness.

Figure 16C:
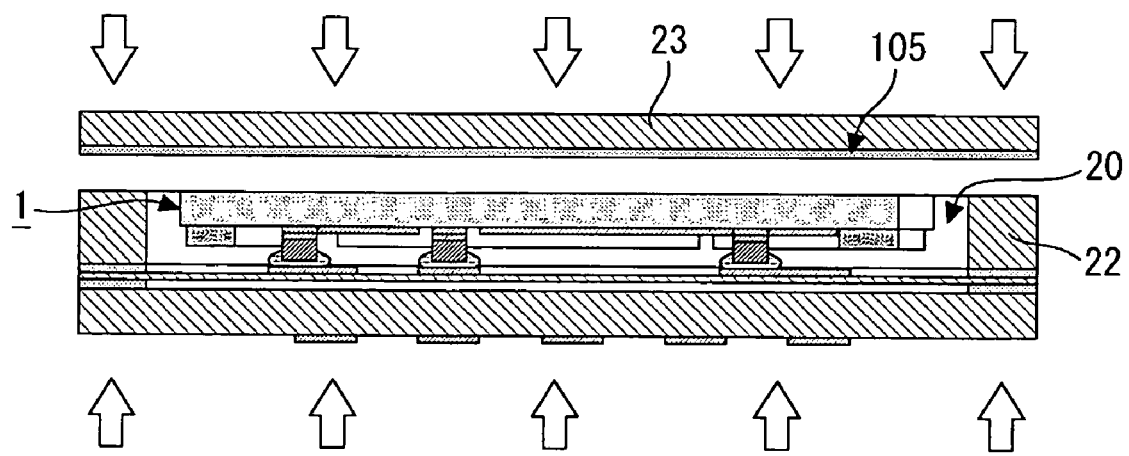

Then, as shown in FIG. 16C, the lid 23 with the adhesive layer 105 being provided thereto is placed on the frame member 22 so as to seal the cavity 20. Then, the laminate is pressurized from both sides while being heated, so that the lid 23 can be fixed to the frame member 22 by the adhesive layer 105.

It is to be noted that FIGS. 16A through 16C are directed to the single SAW device 100. However, many SAW devices 100 may be produced simultaneously. This uses multiple-parts-arranged substrates, each of which has a two-dimensional arrangement of parts. For example, the flexible mounting boards 21 are arranged on the multiple-parts-arranged substrate in matrix formation. Similarly, a respective multiple-parts-arranged substrate is prepared for each of the upper frame substrate 22, the lower board 101 and the lids 23. These substrates are joined together, so that the resultant laminate has many SAW devices 100 joined together. Then, the laminate is then separated into the individual SAW devices 100 by using laser or an appropriate blade.

(Sixth Embodiment)

Figure 17A:
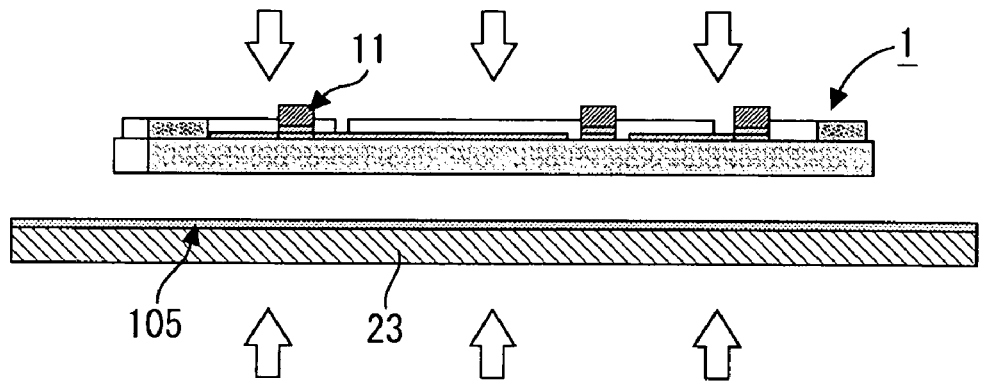
FIGS. 17A, 17B and 17C are respectively diagrams that show another process of the fabricating the SAW device shown in FIGS. 14A through 14C according to a sixth embodiment of the present invention.
Figure 17B:
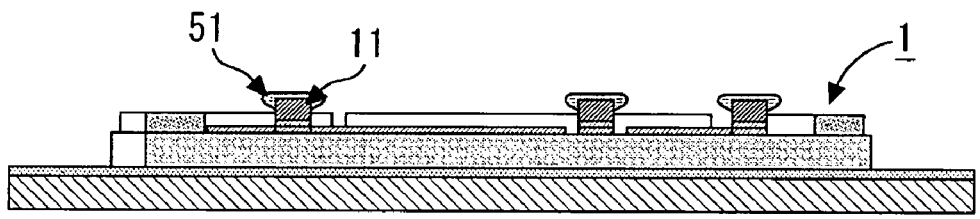
Figure 17C:
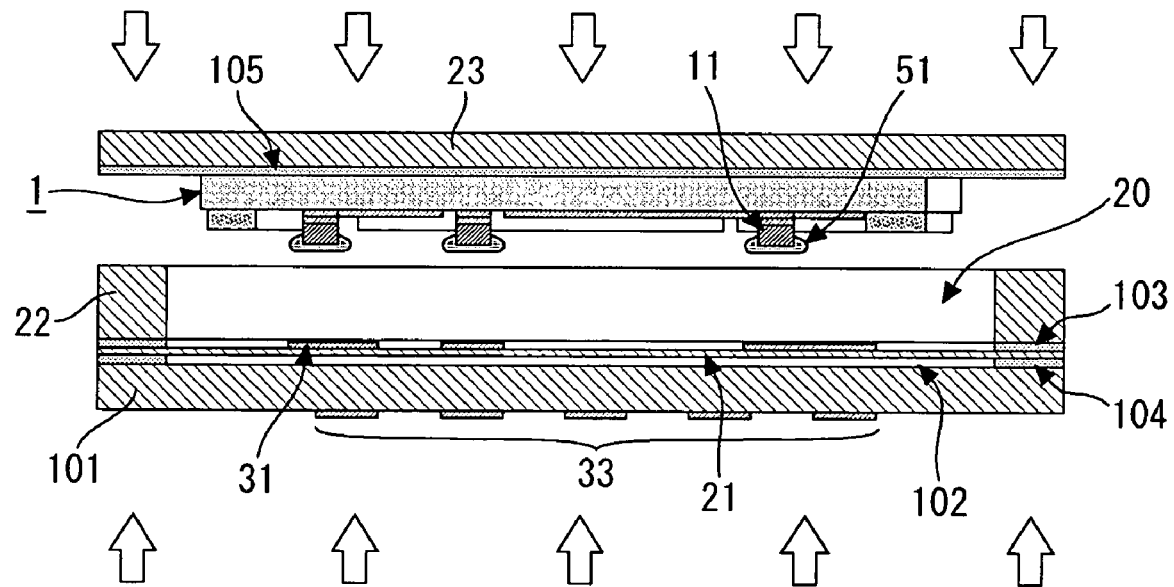

A sixth embodiment of the present invention is a variation of the process by the fifth embodiment of the invention. FIGS. 17A through 17C show this variation, in which parts that are the same as those shown in the previously described figures are given the same reference numerals.

Referring to FIG. 17A, the SAW filter chip 1 is bonded to the lid 23 in the face-up fashion. The backside of the SAW filter chip 1 adheres to the lid 23 by the adhesive layer 105. Next, the conductive resin is transferred onto the metal bumps 11 of the chip 1 from the conductive adhesive layer by using squeegee. Then, as shown in FIG. 17C, the lid 23 to which the SAW filter chip 1 is attached is turned upside down, and is placed on the frame member 22 of the package composed of the chip mounting base 21, the frame member 22 and the lower board 101 so that the cavity 20 is covered with the lid 23. Then, the laminate thus arranged is pressurized while being heated, so that the laminated members can be fixed together. The package can be produced by the process shown in FIG. 16A. The process shown in FIGS. 17A through 17C may be applied to multiple-parts-arranged substrates.

The present invention is not limited to the specifically disclosed embodiments, but other embodiments, variations and modifications may be made without departing from the scope of the present invention.

The present invention is based on Japanese Patent Application Nos. 2003-18777 and 2003-377893 filed on Jan. 28, 2003 and Nov. 7, 2003, respectively, the entire disclosure of which is hereby incorporated by reference.

What is claimed is:

1. A surface acoustic wave device comprising:
    a surface acoustic wave filter element having a piezoelectric substrate on which comb-like electrodes are formed; and
    a package having a first cavity in which the surface acoustic wave filter is housed,
    the package including a flexible chip mounting base that has a first surface on which the surface acoustic wave filter is mounted and has a thickness equal to or less than 100 μm.

2. The surface acoustic wave device as claimed in claim 1, wherein the package has a second cavity via which a second surface of the flexible chip mounting base opposite to the first surface is exposed.

3. The surface acoustic wave device as claimed in claim 1, wherein the package includes a lower frame member that is attached to the flexible chip mounting base and defines a second cavity having a size larger than that of the surface acoustic wave filter chip.

4. The surface acoustic wave device as claimed in claim 1, wherein the package includes:
    a second cavity to which a second surface of the flexible chip mounting base opposite to the first surface is exposed; and
    a lid board that seals the second cavity.

5. The surface acoustic wave device as claimed in claim 1, wherein the package includes a lower board having a plate shape, the lower board being attached to the flexible chip mounting base at positions that are further out than the surface acoustic wave filter chip.

6. The surface acoustic wave device as claimed in claim 5, further comprising an adhesive layer that joins the flexible chip mounting base and the lower board and are provided at the positions that are further out than the surface acoustic wave filter chip.

7. The surface acoustic wave device as claimed in claim 1, wherein the package includes a lid that hermetically seals the first cavity and is attached to a backside of the surface acoustic wave filter chip.

8. The surface acoustic wave device as claimed in claim 1, wherein the package includes a lid that hermetically seals the first cavity, and an electrical shield member that is attached to the lid and faces the surface acoustic wave filter chip.

9. The surface acoustic wave device as claimed in claim 8, wherein the electrical shield member is a planar pattern.

10. The surface acoustic wave device as claimed in claim 1, the package includes an electrical shield member attached to the flexible chip mountingbase.

11. The surface acoustic wave device as claimed in claim 10, wherein the electrical shield member is a planar pattern.

12. The surface acoustic wave device as claimed in claim 1, wherein the surface acoustic wave filter chip has metal bumps, which are electrically and mechanically connected to on-base interconnection lines on the flexible chip mounting base via an electrically conductive resin.

13. The surface acoustic wave device as claimed in claim 1, wherein the surface acoustic wave filter chip has metal bumps, which are electrically and mechanically connected to on-base interconnection lines on the flexible chip mounting base via an electrically anisotropic conductive sheet.

14. The surface acoustic wave device as claimed in claim 1, wherein the surface acoustic wave filter chip is flip-chip bonded to the flexible chip mounting base in the first cavity.

15. The surface acoustic wave device as claimed in claim 1, wherein the flexible chip mounting base has a bending elastic stiffness of 2~8 GPa.

16. The surface acoustic wave device as claimed in claim 1, wherein the flexible chip mounting base includes at least one of bismaleimide-triazine resin, polyphenylether and polyimide resin.

17. The surface acoustic wave device as claimed in claim 1, wherein the package comprises a lower board provided so that another cavity is defined between the flexible chip mounting base and the lower board.

18. The surface acoustic wave device as claimed in claim 1, wherein terminals for making external connections are provided on a backside of the flexible chip mountingbase.

* * * * *